(12) United States Patent
Korobov et al.

(10) Patent No.: US 8,607,424 B1
(45) Date of Patent: Dec. 17, 2013

(54) REVERSE MIM CAPACITOR

(75) Inventors: Vladimir Korobov, San Mateo, CA (US); Oliver Pohland, San Jose, CA (US)

(73) Assignee: Cypress Semiconductor Corp., San Jose, CA (US)

(*) Notice: Subject to any disclaimer, the term of this patent is extended or adjusted under 35 U.S.C. 154(b) by 326 days.

(21) Appl. No.: 13/046,640

(22) Filed: Mar. 11, 2011

Related U.S. Application Data

(62) Division of application No. 11/644,535, filed on Dec. 22, 2006, now Pat. No. 7,944,020.

(51) Int. Cl.
*H01G 7/00* (2006.01)

(52) U.S. Cl.
USPC ....... 29/25.42; 29/25.41; 29/25.03; 29/592.1; 257/532; 361/313

(58) Field of Classification Search
USPC .............. 29/25.41–25.42, DIG. 16, 831–832, 29/852, 847; 361/306.3, 308.2, 311–313, 361/321.4–321.25; 438/690, 430; 257/532, 257/E29.343, 303
See application file for complete search history.

(56) References Cited

U.S. PATENT DOCUMENTS

| | | |
|---|---|---|
| 4,317,134 A | 2/1982 | Woo et al. |
| 4,656,503 A | 4/1987 | Hynecek |
| 4,942,474 A | 7/1990 | Akimoto et al. |
| 4,987,321 A | 1/1991 | Toohey |
| 5,034,633 A | 7/1991 | Stekelenburg |
| 5,187,583 A | 2/1993 | Hamasaki |
| 5,204,761 A | 4/1993 | Gusmano |
| 5,296,696 A | 3/1994 | Uno |
| 5,317,406 A | 5/1994 | Kobayashi et al. |
| 5,406,447 A * | 4/1995 | Miyazaki ..................... 361/313 |
| 5,434,619 A | 7/1995 | Yonemoto |
| 5,471,515 A | 11/1995 | Fossum et al. |
| 5,488,415 A | 1/1996 | Uno |
| 5,512,750 A | 4/1996 | Yanka et al. |
| 5,519,441 A | 5/1996 | Gusmano et al. |
| 5,572,074 A | 11/1996 | Standley |
| 5,576,763 A | 11/1996 | Ackland et al. |
| 5,608,345 A | 3/1997 | Macbeth et al. |
| 5,625,412 A | 4/1997 | Aciu et al. |
| 5,631,704 A | 5/1997 | Dickinson et al. |
| 5,698,844 A | 12/1997 | Shinohara et al. |
| 5,708,471 A | 1/1998 | Okumura |

(Continued)

FOREIGN PATENT DOCUMENTS

WO    WO2004064025 A2    7/2004

OTHER PUBLICATIONS

"Autobrite: Method for Controlling the Dynamic Range of an Image Sensor," SMaL Camera Technologies, Dec. 7, 2001; 8 pages.

(Continued)

*Primary Examiner* — Minh Trinh

(57) ABSTRACT

A method and apparatus for a reverse metal-insulator-metal (MIM) capacitor. The apparatus includes a lower metal layer, a bottom electrode, and an upper metal layer. The lower metal layer is disposed above a substrate layer. The bottom electrode is disposed above the lower metal layer and coupled to the lower metal layer. The upper metal layer is disposed above the bottom electrode. The upper metal layer comprises a top electrode of a metal-insulator-metal (MIM) capacitor.

5 Claims, 10 Drawing Sheets

(56) References Cited

U.S. PATENT DOCUMENTS

| | | |
|---|---|---|
| 5,714,909 A | 2/1998 | Jackson |
| 5,717,458 A | 2/1998 | Yonemoto |
| 5,739,562 A | 4/1998 | Ackland et al. |
| 5,742,047 A | 4/1998 | Buhler et al. |
| 5,745,224 A | 4/1998 | Kusaka |
| 5,877,715 A | 3/1999 | Gowda et al. |
| 5,880,460 A | 3/1999 | Merrill |
| 5,892,540 A | 4/1999 | Kozlowski et al. |
| 5,946,033 A | 8/1999 | Mooney et al. |
| 5,949,483 A | 9/1999 | Fossum et al. |
| 5,962,844 A | 10/1999 | Merrill et al. |
| 5,965,871 A | 10/1999 | Zhou et al. |
| 5,969,758 A | 10/1999 | Sauer et al. |
| 6,067,113 A | 5/2000 | Hurwitz et al. |
| 6,115,066 A | 9/2000 | Gowda et al. |
| 6,130,423 A | 10/2000 | Brehmer et al. |
| 6,133,862 A | 10/2000 | Dhuse et al. |
| 6,163,024 A | 12/2000 | Kozuka et al. |
| 6,169,317 B1 | 1/2001 | Sawada et al. |
| 6,180,976 B1 | 1/2001 | Roy |
| 6,191,412 B1 | 2/2001 | Afghahi |
| 6,204,524 B1 | 3/2001 | Rhodes |
| 6,218,656 B1 | 4/2001 | Guidash |
| 6,320,616 B1 | 11/2001 | Sauer |
| 6,366,312 B1 | 4/2002 | Crittenden |
| 6,438,276 B1 | 8/2002 | Dhuse et al. |
| 6,456,326 B2 | 9/2002 | Fossum et al. |
| 6,473,124 B1 | 10/2002 | Panicacci et al. |
| 6,483,541 B1 | 11/2002 | Yonemoto et al. |
| 6,492,223 B2 * | 12/2002 | Kanamori et al. ............ 438/240 |
| 6,493,030 B1 | 12/2002 | Kozlowski et al. |
| 6,519,371 B1 | 2/2003 | Pain et al. |
| 6,532,040 B1 | 3/2003 | Kozlowski et al. |
| 6,566,697 B1 | 5/2003 | Fox et al. |
| 6,587,142 B1 | 7/2003 | Kozlowski et al. |
| 6,642,494 B1 | 11/2003 | Endo |
| 6,642,564 B2 | 11/2003 | Ogawa et al. |
| 6,697,111 B1 | 2/2004 | Kozlowski et al. |
| 6,700,771 B2 | 3/2004 | Bhattacharyya |
| 6,703,959 B2 | 3/2004 | Kuwabara |
| 6,727,946 B1 | 4/2004 | Zhao et al. |
| 6,734,897 B1 | 5/2004 | Mentzer |
| 6,747,695 B1 | 6/2004 | Afghahi |
| 6,770,926 B2 * | 8/2004 | Kim .............................. 257/296 |
| 6,777,660 B1 | 8/2004 | Lee |
| 6,777,776 B2 * | 8/2004 | Hieda ........................... 257/532 |
| 6,780,727 B2 | 8/2004 | Hwei et al. |
| 6,801,255 B2 | 10/2004 | Inui |
| 6,847,070 B2 | 1/2005 | Fox |
| 6,853,082 B1 * | 2/2005 | Chen et al. .................... 257/762 |
| 6,902,972 B2 * | 6/2005 | Tsau ............................ 438/253 |
| 6,903,670 B1 | 6/2005 | Lee et al. |
| 6,911,640 B1 | 6/2005 | Bencuya et al. |
| 6,917,027 B2 | 7/2005 | Krymski |
| 6,958,776 B2 | 10/2005 | Mendis et al. |
| 6,960,796 B2 | 11/2005 | Rhodes et al. |
| 6,993,814 B2 * | 2/2006 | Adler ........................... 29/25.42 |
| 7,008,816 B2 | 3/2006 | Mcclure |
| 7,038,259 B2 | 5/2006 | Rhodes |
| 7,045,753 B1 | 5/2006 | Fox |
| 7,112,504 B2 * | 9/2006 | Hsin et al. .................... 438/386 |
| 7,113,212 B2 | 9/2006 | Yonemoto et al. |
| 7,154,075 B2 | 12/2006 | Krymski |
| 7,154,548 B2 | 12/2006 | Liu |
| 7,242,427 B2 | 7/2007 | Kokubun et al. |
| 7,274,396 B2 | 9/2007 | Bock |
| 7,283,168 B2 | 10/2007 | Watanabe |
| 7,408,577 B2 | 8/2008 | Nakamura et al. |
| 7,446,805 B2 | 11/2008 | Lee et al. |
| 7,456,879 B2 | 11/2008 | Lim et al. |
| 7,489,354 B2 | 2/2009 | Lee et al. |
| 7,489,355 B2 | 2/2009 | Lee et al. |
| 7,554,584 B2 | 6/2009 | Lim |
| 7,688,366 B2 | 3/2010 | Beck |
| 7,944,020 B1 * | 5/2011 | Korobov et al. .............. 257/532 |
| 8,209,829 B2 * | 7/2012 | Takahashi et al. ........... 29/25.42 |
| 8,375,539 B2 * | 2/2013 | Dunn et al. .................. 29/25.42 |
| 2003/0076431 A1 | 4/2003 | Krymski |
| 2003/0211731 A1 | 11/2003 | Kai et al. |
| 2004/0087101 A1 | 5/2004 | Balakumar et al. |
| 2004/0142528 A1 | 7/2004 | Bhattacharyya |
| 2005/0018060 A1 | 1/2005 | Takayanagi |
| 2005/0161765 A1 | 7/2005 | Tsau |
| 2005/0189577 A1 | 9/2005 | Wang |
| 2005/0212082 A1 * | 9/2005 | Takeda et al. ................ 257/534 |
| 2005/0258512 A1 | 11/2005 | Tu |
| 2006/0077273 A1 | 4/2006 | Lee et al. |
| 2006/0183280 A1 * | 8/2006 | Lee et al. ..................... 438/239 |
| 2006/0223276 A1 * | 10/2006 | Lin et al. ...................... 438/393 |
| 2007/0232014 A1 * | 10/2007 | Larsen et al. ................. 438/393 |

OTHER PUBLICATIONS

"Ultra-Pocket 5 Kit. Rapid Development Kit for 3.0-Megapixel Credit Card Cameras with Color TFT LCD Display," SMaL Camera, Aug. 25, 2005, Technologies, <http://www.smalcamera.com/up5lcd.html>, pp. 1-3; 3 pages.

U.S. Appl. No. 11/644,535: "Reverse MIM Capacitor" Vladimir Korobov et al filed on Dec. 22, 2006; 33 pages.

Decker et al., "A 256 x 256 CMOS Imaging Array with Wide Dynamic Range Pixels and Column-Parallel Digital Output," IEEE Journal of Solid-State Circuits, vol. 33, No. 12, Dec. 1998, pp. 2081-2091; 11 pages.

Kozlowski et al., "A Progressive 1920x1080 Imaging System-on-Chip for HDTV Cameras," IEEE International Solid-State Circuits Conference, Feb. 8, 2005; Session 19, vol. 1, Digest of Technical Papers, pp. 358-359; 2 pages.

USPTO Advisory Action for U.S. Appl. No. 11/644,535 dated Nov. 18, 2009; 3 pages.

USPTO Final Rejection for U.S. Appl. No. 11/644,535 dated Aug. 24, 2009; 9 pages.

USPTO Non Final Rejection for U.S. Appl. No. 11/644,535 dated Jan. 20, 2010; 9 pages.

USPTO Non Final Rejection for U.S. Appl. No. 11/644,535 dated Feb. 25, 2009; 12 pages.

USPTO Notice of Allowance for U.S. Appl. No. 11/644,535 dated Jul. 8, 2010; 6 pages.

USPTO Notice of Allowance for U.S. Appl. No. 11/644,535 dated Oct. 29, 2010; 6 pages.

USPTO Requirement for Restriction for U.S. Appl. No. 11/644,535 dated Nov. 14, 2008; 7 pages.

\* cited by examiner

REVERSE MIM CAPACITOR

RELATED APPLICATIONS

This application is a divisional application of U.S. Non-Provisional application Ser. No. 11/644,535 filed Dec. 22, 2006, which is incorporated herein by reference.

TECHNICAL FIELD

This invention relates to the field of integrated circuits and, in particular, to metal-insulator-metal (MIM) capacitors.

BACKGROUND

Solid-state image sensors are widely used in camera systems. The solid-state image sensors in some camera systems have a matrix of photosensitive elements in series with switching and amplifying elements. The photosensitive elements may be, for example, photoreceptors, photodiodes, PIN diodes, phototransistors, charge-coupled device (CCD) gates, or other similar elements. Each photosensitive element receives incident light corresponding to a portion of a scene being imaged. A photosensitive element, along with its accompanying electronics, is called a picture element ("pixel") or a pixel circuit. Each photosensitive element produces an electrical signal relative to the light intensity of the image. The electrical signal generated by the photosensitive element is typically a current proportional to the amount of electromagnetic radiation (i.e., light) incident on the photosensitive element.

The electrons generated by the photons in the photodiode are converted to voltage in a capacitor (e.g., a sense capacitor) and stored there until the signal is read out of the pixel circuit. In choosing or designing a capacitor for the pixel circuit, there are several considerations including matching, linearity, fill factor, and leakage. Matching refers to the similarity of the photodiode (PD) capacitance and the sense capacitance. Scalability is related to matching. Linearity refers to the linearity of the electrical response of the photodiode resulting from incident light on the photodiode. A pixel's fill factor relates to the amount of pixel area used for the photodiode compared to the total area of the pixel. In other words, fill factor relates to how much of the surface area of an imager is used for photodiodes and how many pixels can be placed into a given surface area. The fill factor of the pixel is at least partially determinative of responsiveness of the pixel (as a part of final signal-to-noise ratio of the pixel). Leakage relates to the amount of energy that is lost over time from a charged capacitor. Leakage of the floating diffusion capacitor can significantly degrade pixel performance.

There are many types of conventional sense capacitor technologies such as diffusion capacitors (usually called floating diffusion (FD) capacitors), metal oxide semiconductor (MOS) capacitors, double poly capacitors, and standard metal-insulator-metal (MIM) capacitors. Each conventional capacitor technology has certain advantages and disadvantages.

Conventional diffusion capacitors are typically implemented using n+ or n-type lightly doped drain (NLDD) regions. While conventional diffusion capacitors do not require additional processing, conventional diffusion capacitors suffer in aspects of linearity, scalability, and dark current (DC) leakage. Conventional floating diffusion capacitors also suffer in that they act as parasitic photodiodes. In addition, achieving large fill factors places severe limits on how large a diffusion capacitor can be and, hence, what the maximum capacitance value can be.

Conventional MOS capacitors are typically implemented using a substrate with an oxide layer on one side. One metal contact is formed on the oxide layer, and a second metal contact is formed on the opposite side of the substrate. Conventional MOS capacitors typically have a high capacitance per unit area. However, conventional MOS capacitors usually suffer in aspects of linearity and scalability. Although additional implantation can provide improved linearity compared to conventional diffusion capacitors, the response is still not linear. Conventional MOS capacitors also suffer in active area usage, which reduces the fill factor of the corresponding pixel circuit. For example, conventional MOS capacitors typically cannot be used for pixels which have a pitch (i.e., width) of less than 3 μm.

Conventional double poly capacitors are typically implemented using two poly layers on a substrate. While double poly capacitors offer relatively good linearity and controllability, conventional double poly capacitors suffer in terms of processing cost and complexity. Conventional double poly capacitors also suffer in regard to scalability and fill factor.

Conventional MIM capacitors are typically implemented between metal layers in a pixel. FIG. 1 illustrates a conventional MIM capacitor 10. The conventional MIM capacitor 10 is formed between an upper metal layer 12 and a lower metal layer 14. For example, in a triple-metal process, the conventional MIM capacitor 10 may be formed between the M3 (e.g., $V_{DD}$) and M2 (e.g., $V_{OUT}$) metal layers. In particular, the lower metal layer is used as a bottom electrode of the conventional MIM capacitor, and a top electrode 16 is coupled to the upper metal layer 12 by a via 18 through a dielectric layer 20 separating the upper metal layer 12 from the lower metal layer 14. The top electrode 16 and the lower metal layer 14, which form the conventional MIM capacitor 10, are separated by a dielectric layer 22.

FIG. 2 illustrates a pixel stack 40 using conventional MIM capacitors 10. As described above, the conventional MIM capacitors 10 are formed between the M2 and M3 metal layers. Since the conventional MIM capacitors 10 use the M2 metal layer as a bottom electrode, and the M2 metal layer is typically used for routing output voltages, the physical size and capacitance of the conventional MIM capacitors 10 are limited.

FIG. 3 illustrates a pixel routing layout 60 using conventional MIM capacitors 10. As described above, the conventional MIM capacitors 10 are typically implemented between an upper metal layer 12 and a lower metal layer 14 (shown dashed). The physical area of the conventional MIM capacitor 10 is represented by the dielectric layer 22 between the top electrode 16 and the lower metal layer 14, which is the bottom electrode of the conventional MIM capacitor 10. Although the top electrode 16 is omitted for clarity, it is similar in size and orientation to the dielectric layer 22. In one embodiment, the upper metal layer 12 (e.g., M3) may define an optical aperture 62 for the photodiode 64 of the pixel stack 40.

Out of the various types of conventional capacitors described above, conventional MIM capacitors are generally the best in terms of linearity, leakage, and controllability. However, the use of conventional MIM capacitors in a pixel circuit drastically reduces the fill factor and increases process cost. This is because additional metal layout (i.e., features) is added to the pixel in order to implement a standard MIM. Since the additional metal will block light transmission to the photodiode, there is a trade-off between fill factor and maximum capacitance of the conventional MIM capacitor.

Additionally, the use of conventional MIM capacitors impacts the routing of the lower metal layer 14. Since the capacitance of the conventional MIM capacitor depends on the available area of the lower metal layer, implementing conventional MIM capacitors can make it difficult to route the lower metal layer. Alternatively, the capacitance of conventional MIM capacitors might suffer if limited surface area of the lower metal layer is accessible. For these reasons, conventional MIM capacitors are typically not used to implement a floating diffusion capacitor in a pixel circuit.

BRIEF DESCRIPTION OF THE DRAWINGS

The present invention is illustrated by way of example, and not by way of limitation, in the figures of the accompanying drawings.

DETAILED DESCRIPTION

Figure 1:
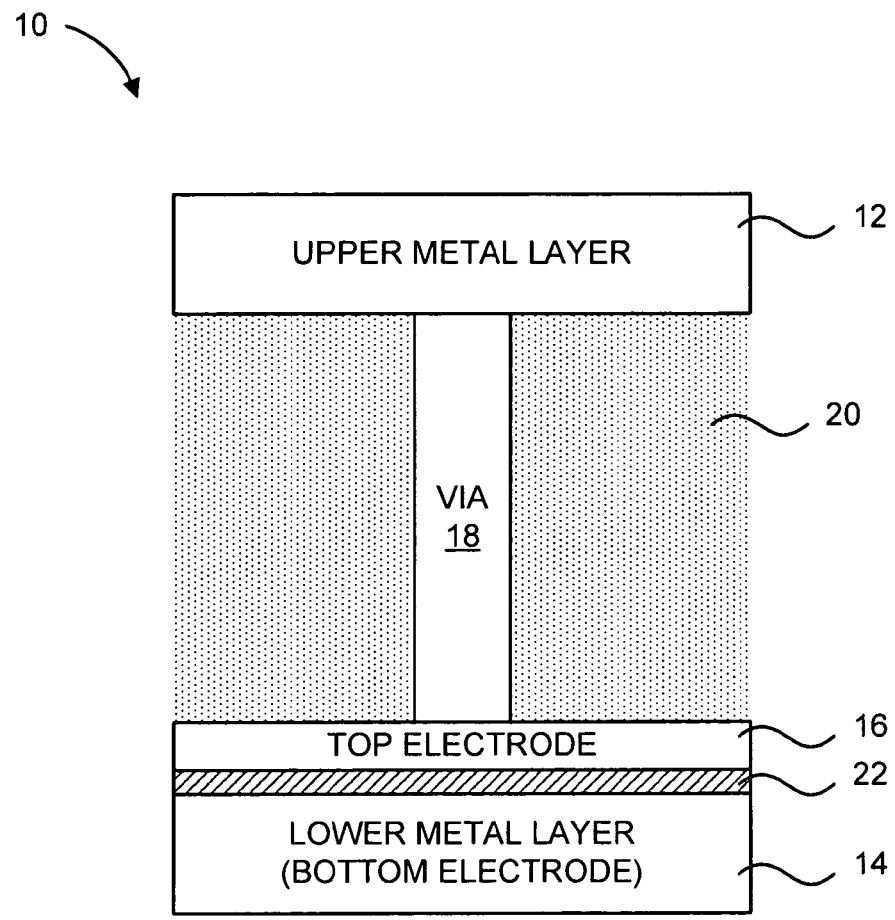
FIG. 1 illustrates a conventional MIM capacitor.
Figure 2:
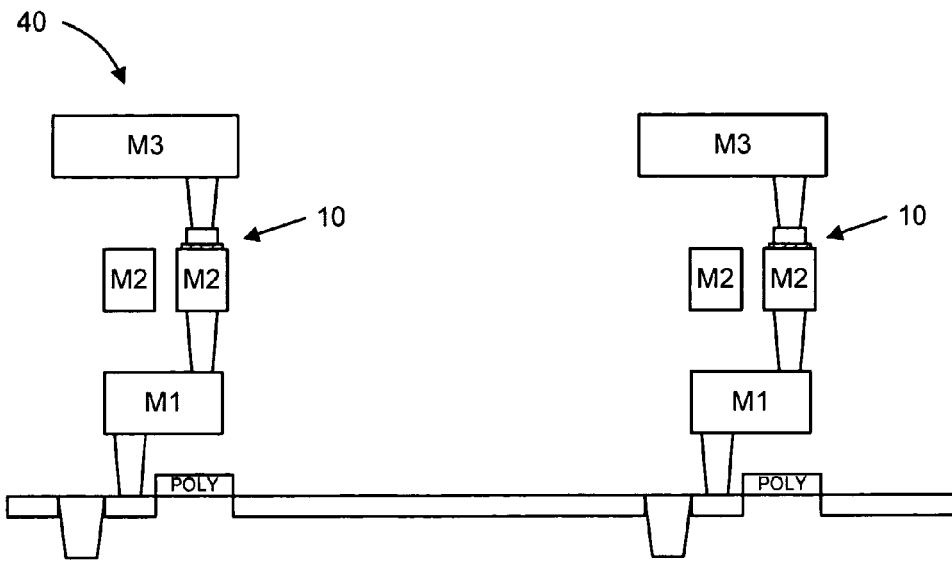
FIG. 2 illustrates one embodiment of a reverse MIM capacitor.
Figure 3:
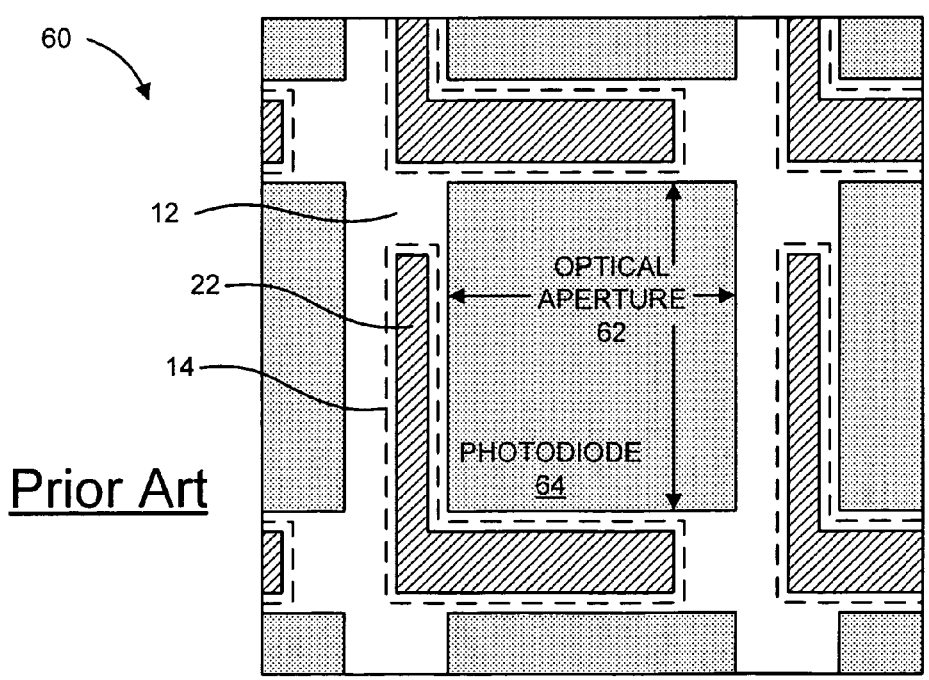
FIG. 3 illustrates a pixel stack using conventional MIM capacitors.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

Embodiments of a method and apparatus are described to implement a reverse MIM capacitor. The reverse MIM capacitor is also referred to as an upside-down MIM capacitor because, in at least one implementation, the components are arranged upside down, compared to a conventional MIM capacitor. For example, the reverse MIM capacitor may include a bottom titanium tungsten (TiW) electrode and a top metal layer (e.g., M3) as a top electrode. In pixel circuits, M3 is often connected to a voltage source (e.g., $V_{DD}$) and used to define the optical aperture of the pixel. The bottom electrode (e.g., TiW) is connected through a stacked VIA to the floating diffusion (FD) node in an intermediate metal layer (e.g., M2). In pixel circuits, M2 is often used for routing pixel outputs.

Some embodiments of the reverse MIM capacitor are implemented in a pixel circuit of an image sensor. In such an embodiment, the reverse MIM provides a controllable and linear sense capacitor. Image sensors may benefit from controllable and linear sense capacitors because they facilitate better capacitance matching between the PD capacitance and sense capacitance, and they allow more accurate color interpolation.

Additionally, some embodiments of the reverse MIM capacitor are further distinguished from conventional MIM capacitors because reverse MIM capacitors may be implemented with little or no fill factor reduction. Also, some embodiments facilitate flexible pixel routing of the metal layers such as a lower metal layer because the capacitance of the reverse MIM capacitor does not depend on the surface area or configuration of the lower metal layers.

One embodiment of an apparatus is described. The apparatus includes a lower metal layer, a bottom electrode, and an upper metal layer. The lower metal layer is disposed above a substrate layer. The bottom electrode is disposed above the lower metal layer and coupled to the lower metal layer. The upper metal layer is disposed above the bottom electrode. The upper metal layer comprises a top electrode of a metal-insulator-metal (MIM) capacitor. In some embodiments, a dielectric layer is disposed between the bottom electrode and the upper metal layer. In some embodiments, the apparatus also includes an etch stop layer disposed between the dielectric layer and the upper metal layer. In some embodiments, the bottom electrode and the upper metal layer are titanium tungsten (TiW). Alternatively, other conductive materials may be used.

Although embodiments of the apparatus may be implemented for several different applications, one embodiment may be implemented in a pixel imager circuit. In some embodiments, the upper metal layer defines an optical aperture of a pixel stack. In some embodiments, the MIM capacitor comprises a floating diffusion capacitor of a pixel in an image sensor. In some embodiments, the pixel is a four-transistor (4T) pixel. In some embodiments, the floating diffusion capacitor is a shared capacitor to be shared with the pixel and at least one additional pixel.

Another embodiment of an apparatus is also described. In one embodiment, the apparatus includes means for implementing a metal-insulator-metal (MIM) capacitor in a pixel circuit of an imager having at least two metal layers. A lower metal layer is used for routing, and an upper metal layer is disposed above the lower metal layer. The apparatus also includes means for providing increased fill factor of the imager. In one embodiment, the means for providing increased fill factor of the imager includes an embodiment of a reverse MIM capacitor. Other embodiments of the apparatus are also described.

An embodiment of a method is also described. In one embodiment, the method includes forming a lower metal layer above a substrate, forming a bottom electrode of a MIM capacitor above the lower metal layer, and forming an upper metal layer above the lower metal layer and the bottom electrode. The upper metal layer is a top electrode of the MIM capacitor, and the bottom electrode is coupled to the lower metal layer. In some embodiments, the upper metal layer comprises a top metal layer of a pixel stack. In some embodiments, forming the upper metal layer includes defining an optical aperture of the pixel stack. In some embodiments, the upper metal layer is an intermediate metal layer of a pixel stack. Other embodiments of the method are also described.

Figure 4:
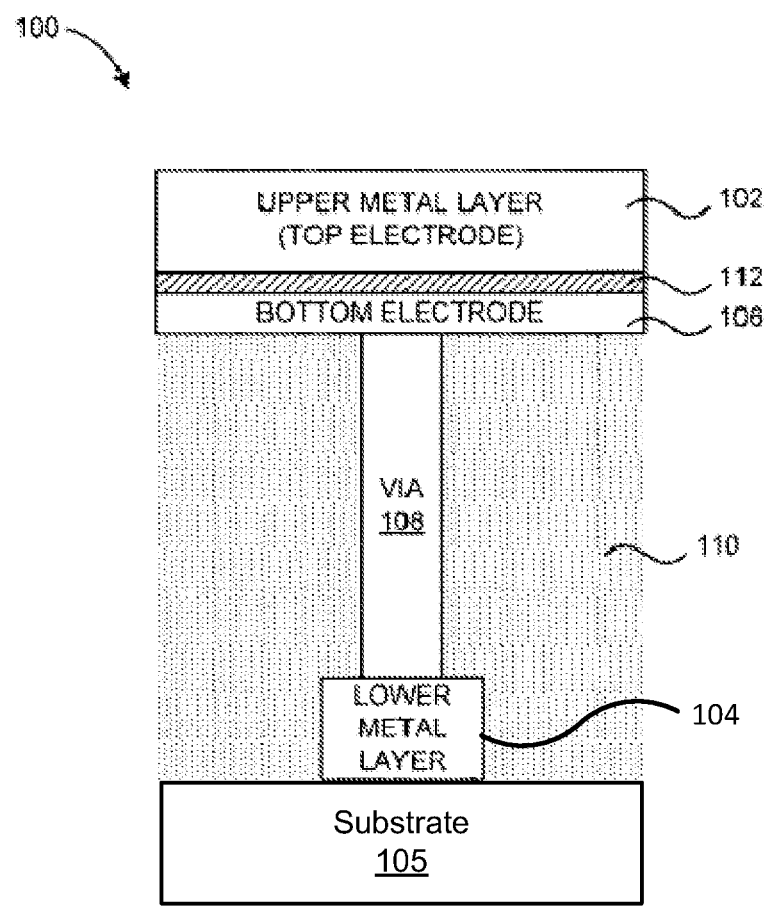
FIG. 4 illustrates one embodiment of a pixel stack using reverse MIM capacitors.

FIG. 4 illustrates one embodiment of a reverse MIM capacitor 100. In one embodiment, the reverse MIM capacitor 100 is implemented using a triple-metal process, although other embodiments may be implemented in circuits which have fewer or more metal layers. The reverse MIM capacitor 100 is formed between an upper metal layer 102 and a lower metal layer 104. For example, in a triple-metal process, the reverse MIM capacitor 100 may be formed between the M3 (e.g., $V_{DD}$) and M2 (e.g., $V_{OUT}$) metal layers.

Rather than using the lower metal layer 104 as a bottom electrode, as in the conventional MIM capacitor 10, the reverse MIM capacitor 100 implements the top metal layer 102 as a top electrode. A bottom electrode 106 is coupled to the lower metal layer 104 by a stacked via 108 through a dielectric layer 110 separating the upper metal layer 102 from the lower metal layer 104. In this way, the bottom electrode 106 and the upper metal layer 102 form the reverse MIM capacitor 100. A dielectric layer 112 separates the bottom electrode 106 from the upper metal layer 102.

Figure 5:
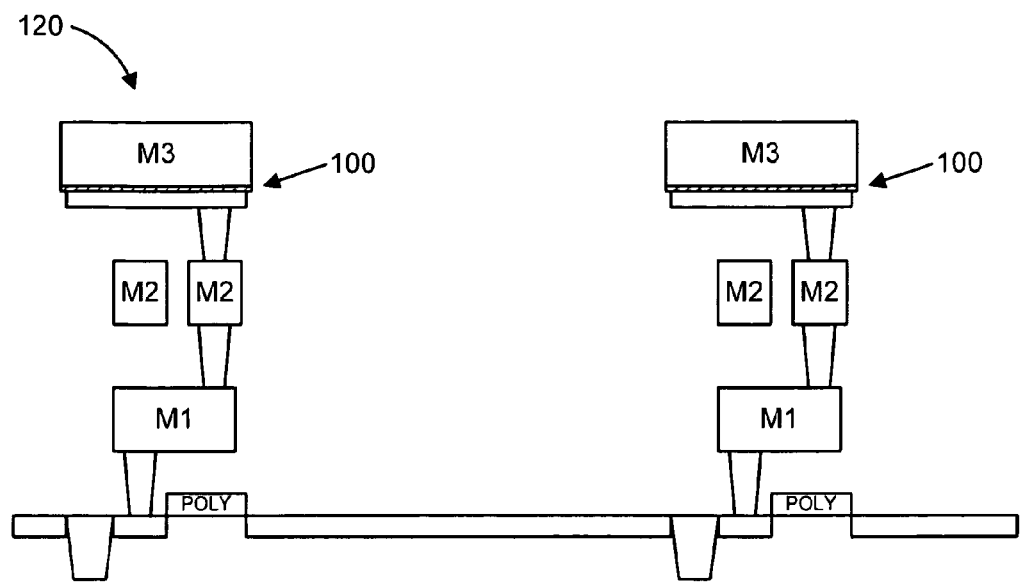
FIG. 5 illustrates a pixel routing layout using conventional MIM capacitors.

FIG. 5 illustrates one embodiment of a pixel stack 120 using reverse MIM capacitors 100. In a pixel stack 120, the top metal layer (e.g., M3) is typically used to provide a source voltage (e.g., $V_{DD}$) to the pixels, so the M3 metal layer usually has substantially more surface area than the M2 metal layer. Thus, implementing a reverse MIM capacitor 100 using the M3 metal layer in a pixel allows the physical size and capacitance of the reverse MIM capacitor 100 to be significantly greater than the conventional MIM capacitor 10. For example, the reverse MIM capacitor 100 may have a capacitance up to 22 fF in a 6.4 μm pixel, whereas the conventional MIM capacitor 10 in the same pixel may have a capacitance of about 6 fF. Hence, in this example, the reverse MIM capacitor 100 may have over three times the capacitance of a conventional MIM capacitor 10. Other implementations may provide more or less of an increase in capacitance.

Figure 6:
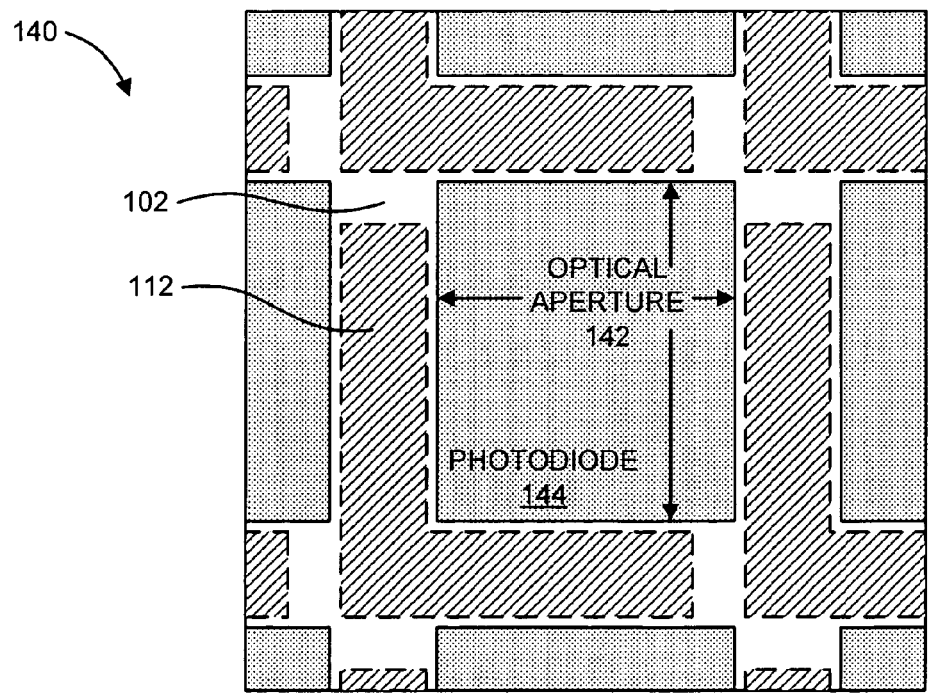
FIG. 6 illustrates one embodiment of a pixel routing layout using reverse MIM capacitors.

FIG. 6 illustrates one embodiment of a pixel routing layout 140 using reverse MIM capacitors 100. As described above, embodiments of the reverse MIM capacitors 100 are implemented between an upper metal layer 102 and a lower metal layer 104. In FIG. 6, the lower metal layer 104 is not shown because the size of the reverse MIM capacitor 100 is independent of the size of the lower metal layer 104 (except that the bottom electrode layer 106 is coupled to the lower metal layer 104 by a via 108). The physical area of the reverse MIM capacitor 100 is represented by the bottom electrode layer 106 (dielectric layer 112 is between the bottom electrode 106 and the upper metal layer 102). In one embodiment, the upper metal layer 102 (e.g., M3) may define an optical aperture 142 for the photodiode 144 of the pixel stack 120. Implementing the reverse MIM capacitor 100 in this manner may facilitate maximizing the size of the floating diffusion capacitor in the pixel stack 120.

Figure 7:
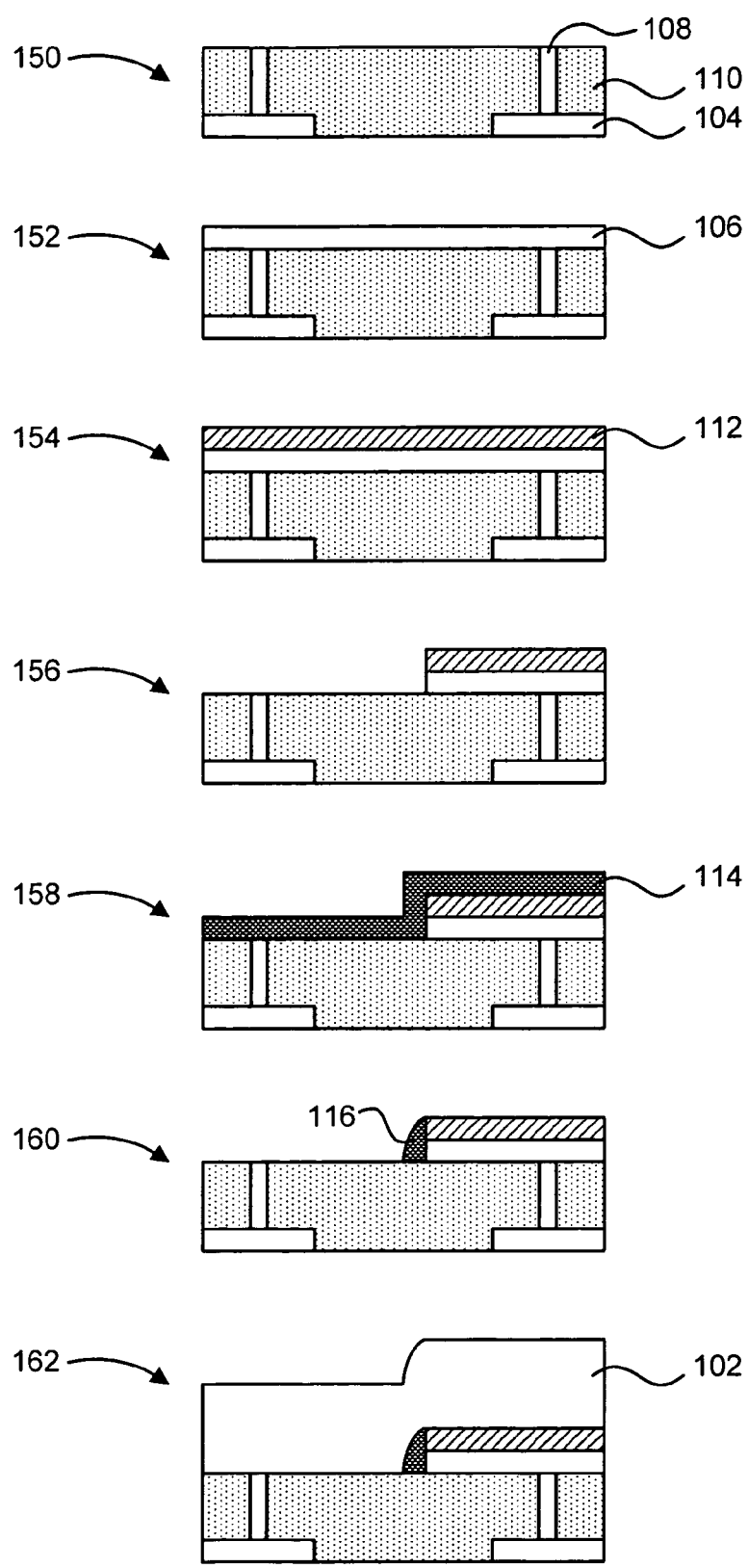
FIG. 7 illustrates one embodiment of a fabrication process for a reverse MIM capacitor.

FIG. 7 illustrates one embodiment of a fabrication process for a reverse MIM capacitor 100. While the illustrated fabrication process includes specific operations, as described below, other implementations of the fabrication process may use other operations instead of or in addition to the depicted operations. Furthermore, the illustrated fabrication process may omit some typical operations for clarity and convenience.

In a first operation 150, a base structure including a lower metal layer 104, stacked vias 108, and a dielectric material 110 is formed. The depicted implementation includes two separate routing traces on the lower metal layer 104 with corresponding stacked vias 108 for each of the traces. The formation of such layers is well known and not described further.

In a second operation 152, the bottom electrode 106 is formed on the base structure. In one embodiment, the bottom electrode 106 is formed with titanium tungsten (TiW). Alternatively, other conductive materials such as aluminum (Al) or titanium nitride (TiN) may be used.

In a third operation 154, the dielectric layer 112 is formed on the bottom electrode 106. In one embodiment, the dielectric layer 112 is formed with silicon nitride (SiN). Alternatively, other types of dielectric materials such as aluminum dioxide ($AlO_2$) may be used.

In a fourth operation 156, some of the bottom electrode 106 and dielectric layer 112 may be removed. In one embodiment, a photoresistive process may be used in which a photoresist material (not shown) is layered on the area of the dielectric layer 112 to remain. The exposed surface of the dielectric layer 112 (and the area of the bottom electrode 106 below the exposed surface of the dielectric layer 112) is then etched with an etching substance to remove the exposed portion of the dielectric layer 112 and corresponding portion of the bottom electrode 106. The photoresist material is then removed from the surface of the remaining dielectric layer 112. Alternatively, other fabrication technologies may be implemented.

In a fifth operation 158, another dielectric material 114 is formed over the exposed dielectric material 110, bottom electrode 106, and dielectric layer 112. In one embodiment, the dielectric layer 114 is formed with silicon dioxide ($SiO_2$). Alternatively, other types of dielectric materials such as silicon nitride (SiN), oxide-nitride (ON), nitride-oxide (NO), oxide-nitride-oxide (ONO), or another dielectric material may be used. In another embodiment, the dielectric material 114 is different from the dielectric material 112.

In a sixth operation 160, the dielectric material 114 is etched back to form a spacer post 116. In one embodiment, a highly anisotropic etch may be implemented to form the spacer post 116. Alternatively, other types of etching methods may be implemented to form the spacer post 116. In one embodiment, the space post 116 insulates the bottom electrode 106 from the upper metal layer 102 subsequently formed on top of the dielectric layer 112.

In a seventh operation 162, the top metal layer 102 is formed on the exposed dielectric material 110, spacer post 116, and dielectric layer 112. As described above, the top metal layer 102 is the top electrode of the reverse MIM capacitor 100. In one embodiment, the upper metal layer 102 is the same conductive material (e.g., TiW) as the bottom electrode 106. Alternatively, the upper metal layer 102 may be another conductive material.

Figure 8:
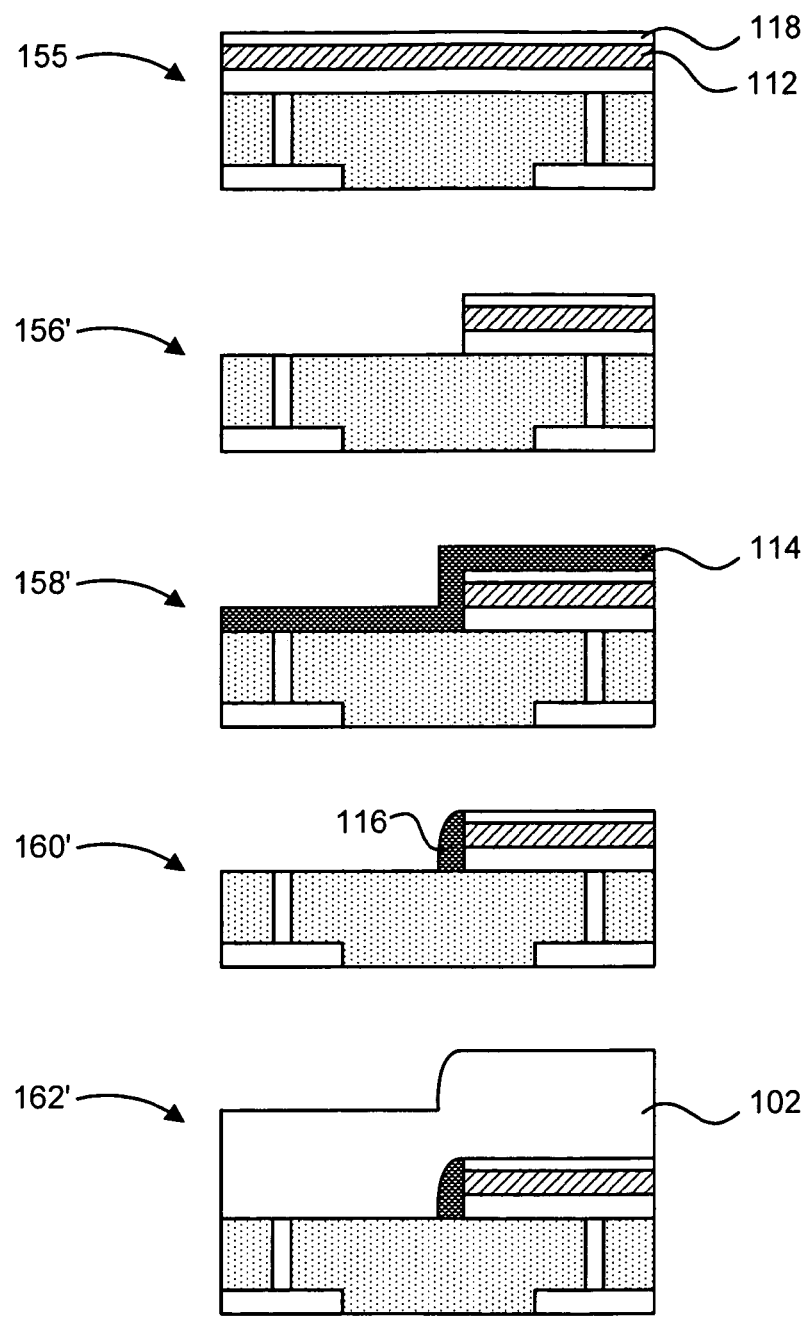
FIG. 8 illustrates another embodiment of a fabrication process for a reverse MIM capacitor.

FIG. 8 illustrates another embodiment of a fabrication process for a reverse MIM capacitor 100. For convenience, the first three operations for the depicted fabrication process are the same as the first three operations 150, 152, and 154 for the fabrication process shown in FIG. 7. In the fourth operation 155, an etch stop layer 118 is formed on the dielectric layer 112. In one embodiment, the etch stop layer 118 is formed to protect the dielectric layer 112 during the photoresist process described above. As an example, the etch stop layer 118 may be formed of TiW, similar to the bottom electrode 106. Alternatively, another etch stop material may be used. The remaining operations 156'-162' are substantially similar to the operations 156-162 described above with reference to FIG. 7.

Figure 9:
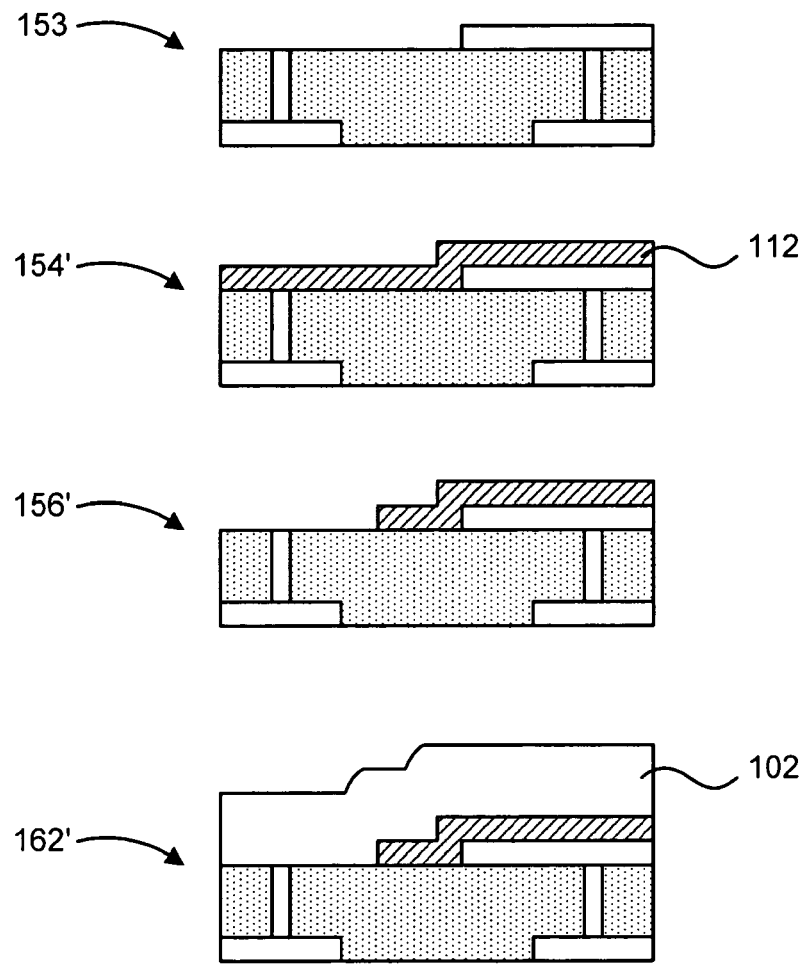
FIG. 9 illustrates another embodiment of a fabrication process for a reverse MIM capacitor.

FIG. 9 illustrates another embodiment of a fabrication process for a reverse MIM capacitor 100. For convenience, the first two operations for the depicted fabrication process are the same as the first two operations 150 and 152 for the fabrication process shown in FIG. 7. In the third operation 153, some of the bottom electrode 106 is removed, for example, using the etching process described above. In the fourth operation 154', the dielectric layer 112 is formed on the remaining portion of the bottom electrode 106, as well as the exposed portion of the dielectric material 110. In a fifth operation 156', the dielectric layer 112 is then etched, as described above. In a sixth operation 162', the top metal layer 102 is formed on the dielectric layer 112 and the exposed dielectric material 110, similar to above.

Figure 10:
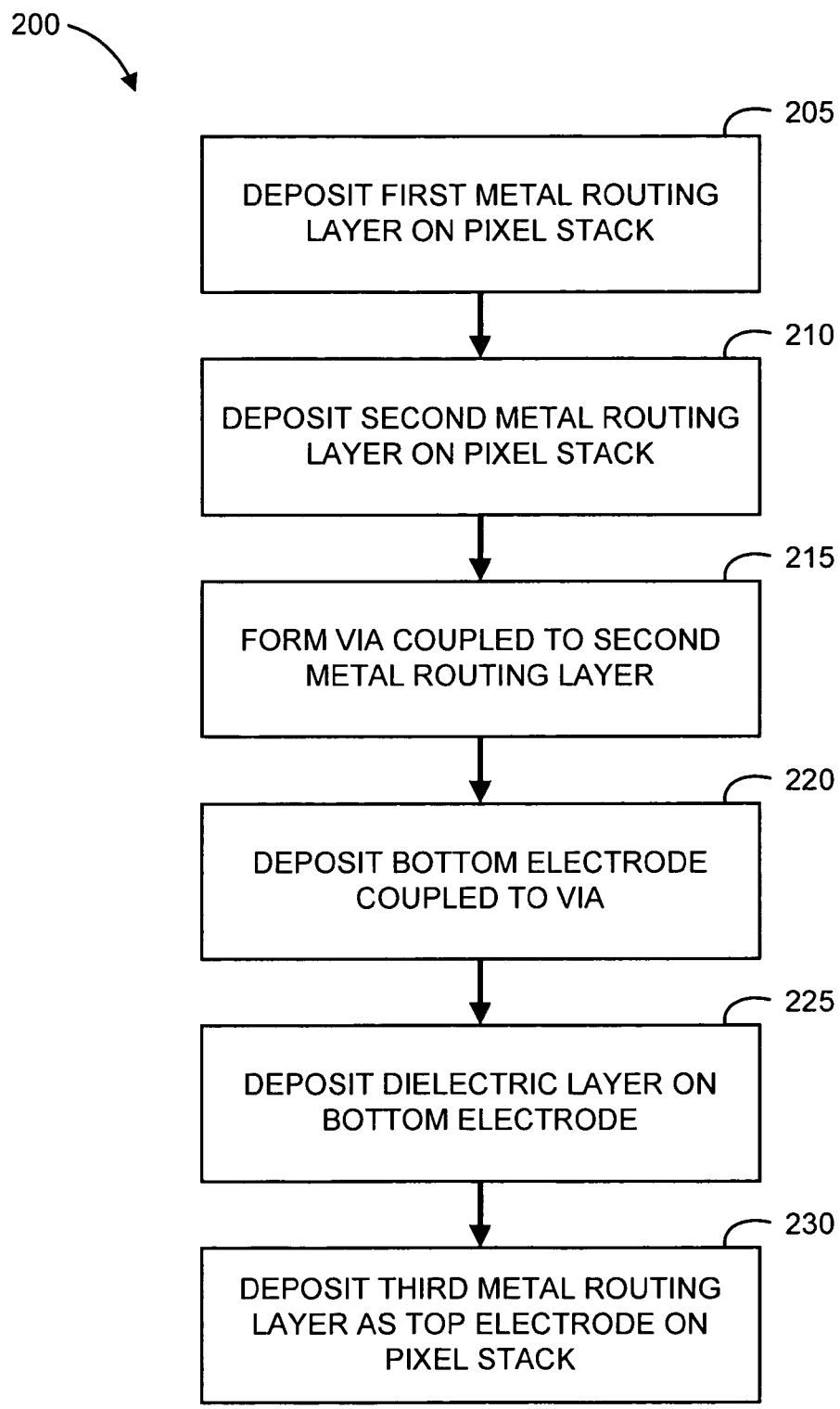
FIG. 10 illustrates one embodiment of a fabrication method for a reverse MIM capacitor.

FIG. 10 illustrates one embodiment of a fabrication method 200 for a reverse MIM capacitor 100. In particular, the fabrication method 200 refers to a triple-metal fabrication process for a pixel stack in which three metal layers are used for power, signals, and routing in the pixel stack. Although the depicted fabrication method 200 includes specific operations, other embodiments of the fabrication method 200 may include fewer or more operations.

In the depicted fabrication method 200, a first metal routing layer is deposited 205 on a pixel stack. Then, a second metal routing layer is deposited 210 on the pixel stack. The second metal routing layer is deposited on top of the first metal routing layer (with an insulating layer between the first and second metal layers). In one embodiment, the second metal routing layer is the lower metal layer 104. Next, a via 108 is formed 215. The via 108 is coupled the second metal routing layer so that the via 108 is in electrical contact with the second metal routing layer.

A bottom electrode 106 of the reverse MIM capacitor 100 is then deposited 220 on the pixel stack. The bottom electrode 106 is electrically coupled to the via 108. Next, a dielectric layer 112 is deposited 225 on the bottom electrode 106. Then, a third metal routing layer such as the upper metal layer 102 is deposited 230 on the dielectric layer 112. In this way, at least a portion of the third metal routing layer serves as a top electrode for the reverse MIM capacitor 100. The depicted fabrication method 200 then ends.

Reverse MIM capacitors 100 formed using the described fabrication method 200, or another similar fabrication method, may be implemented in a variety of circuits. Some embodiments of the reverse MIM capacitor 100 may be implemented in pixel circuits of an image sensor. Many image sensors are implemented using metal oxide semiconductor (MOS) or complimentary metal oxide semiconductor (CMOS) technology. Image sensors with passive pixels and image sensors with active pixels are distinguished within the MOS and CMOS imaging technologies. An active pixel amplifies/buffers the charge that is collected on its photosensitive element. A passive pixel does not perform signal amplification; however, a charge sensitive amplifier that is not integrated in the pixel may be used.

Figure 11:
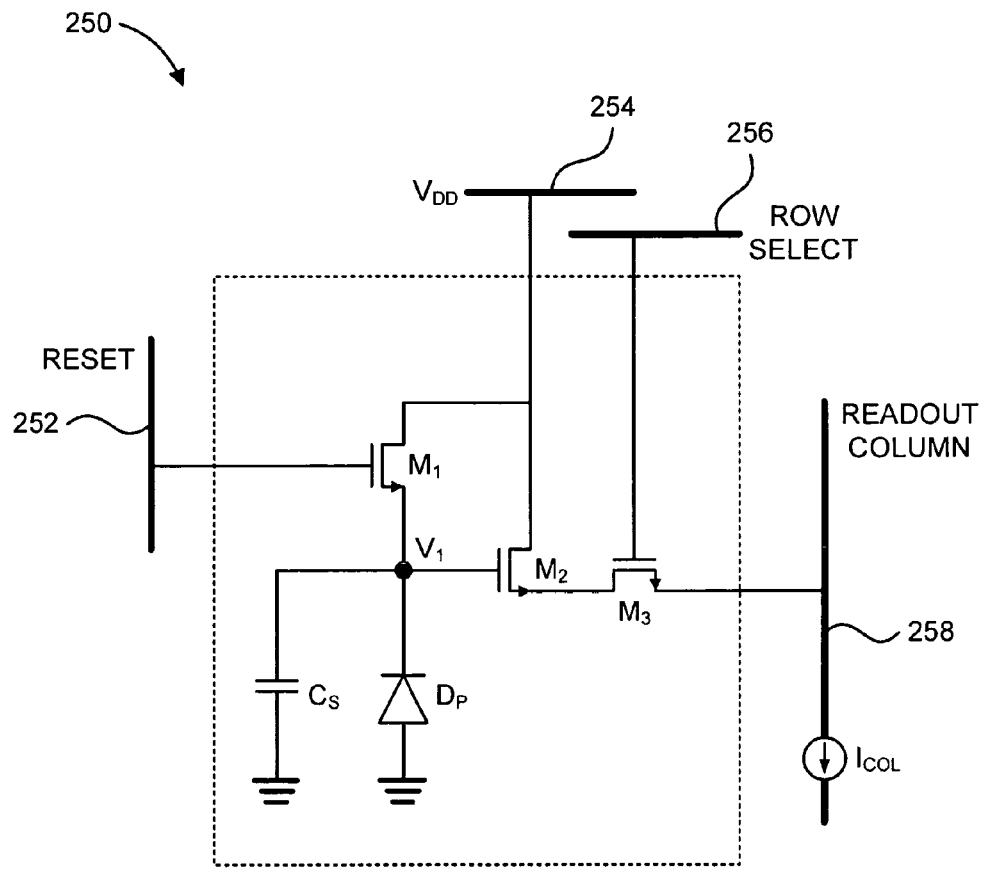
FIG. 11 illustrates one embodiment of a three-transistor (3T) pixel circuit.

FIG. 11 illustrates one embodiment of a three-transistor (3T) pixel circuit 250. In one embodiment, the reverse MIM capacitor 100 may be implemented as a sense capacitor, $C_s$, coupled to a sense node, $V_1$, of the 3T pixel circuit 250. Within the pixel circuit 250, a photodiode, $D_P$, produces a photo current, $I_P$, proportional to the incident light intensity. The photo current is integrated on the sense capacitor, $C_S$. In one embodiment, the sense capacitor is a reverse MIM capacitor 100, as described above. A sense MOS transistor, $M_2$, operates as a source follower to buffer the voltage on the sense node, $V_1$, nondestructively to a readout column line 258. In one embodiment, the sense transistor is coupled to a driving voltage line 254. A row select MOS transistor, $M_3$, acts as a switch to activate the source follower transistor, $M_2$, when the particular row including the pixel 250 is selected. In one embodiment, the row select transistor is coupled to a row select line 256. When the pixel 250 is reset, the gate of a reset MOS transistor, $M_1$, is brought up to a driving voltage, for example $V_{DD}$, and the voltage on the sense capacitor is reset to approximately $V_{DD}$-$V_{TH}$, where $V_{TH}$ is the threshold voltage of the reset transistor. In one embodiment, the reset transistor is coupled to a reset line 252, as well as the driving voltage line 254.

Figure 12:
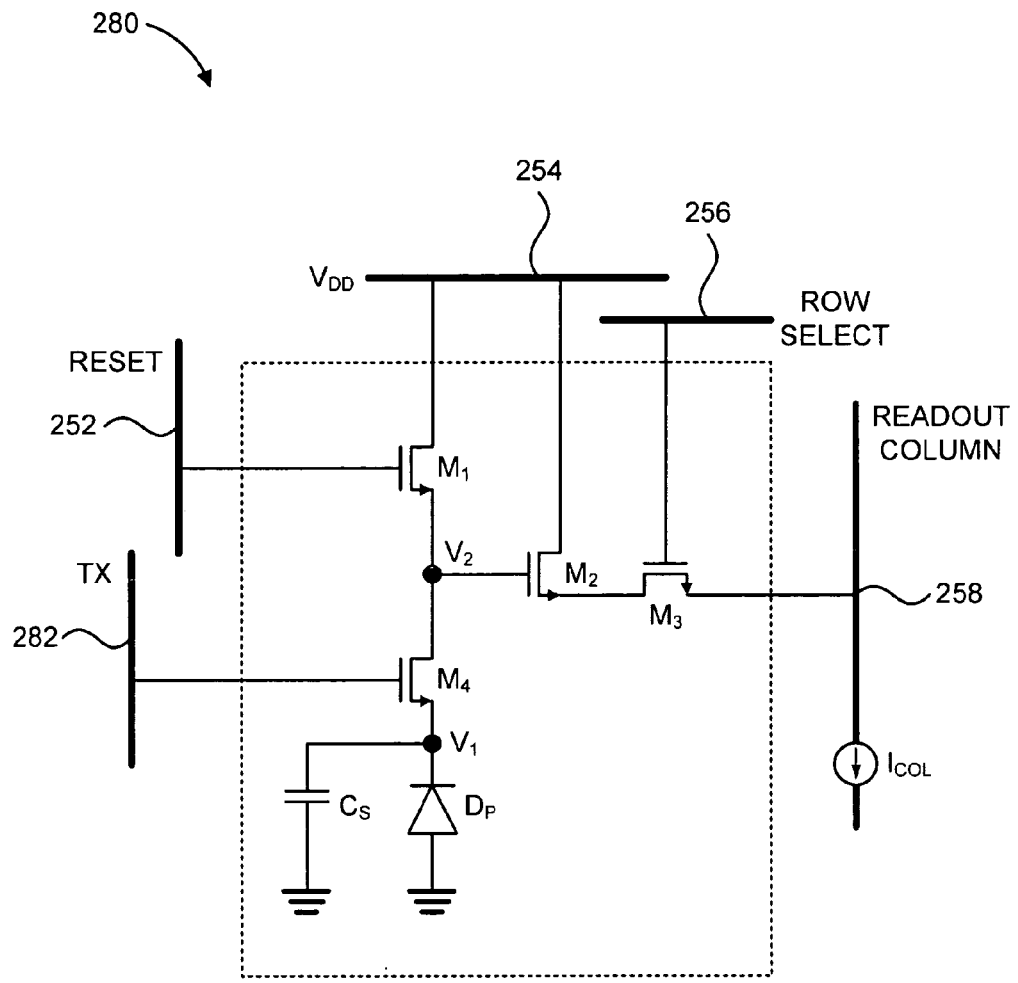
FIG. 12 illustrates one embodiment of a four-transistor (4T) pixel circuit.

FIG. 12 illustrates one embodiment of a four-transistor (4T) pixel circuit 280. Similar to the 3T pixel circuit 250 described above, the reverse MIM capacitor 100 may be implemented in the 4T pixel circuit 280 as a sense capacitor, $C_S$, coupled to the sense node, $V_1$. Within the 4T pixel circuit 280, the photodiode, sense transistor, row select transistor, and reset transistor may function in substantially the same manner as the corresponding components of the 3T pixel circuit 250. Additionally, the 4T pixel circuit 280 includes a transfer transistor, $M_4$, which transfers the integrated voltage from the sense node, $V_1$, to another sense node, $V_2$. In one embodiment, the transfer transistor is coupled to a transfer line 282. Using a 4T pixel circuit 280, as described herein, may provide increased sensitivity by reducing noise in the circuit 280. Also, using a 4T pixel circuit 280 may facilitate implementation of a shared architecture in which the sense node $V_2$, the sense transistor, the row select transistor, and the reset transistor may be shared by several transfer transistors. In particular, multiple transfer transistors (and corresponding photodiodes and sense capacitors) may be coupled to a single sense node, $V_2$. Implementation of a shared architecture in this manner may provide for increased fill factor in an image sensor.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method, comprising:
   forming a lower metal layer above a substrate;
   forming a bottom electrode of a metal-insulator-metal (MIM) capacitor above the lower metal layer;
   forming a dielectric layer disposed between the lower metal layer and the bottom electrode;
   forming a via extending from the lower metal layer to the bottom electrode;
   forming an upper metal layer above the lower metal layer and the bottom electrode, wherein the upper metal layer comprises a top electrode of the MIM capacitor and a top metal layer of a pixel stack; and
   defining an optical aperture in the pixel stack.

2. The method of claim 1, wherein the upper metal layer comprises an intermediate metal layer of a pixel stack.

3. The method of claim 1, further comprising forming a single intermediate layer between the lower metal layer and the upper metal layer, wherein the single intermediate layer comprises a second dielectric layer, wherein the top electrode of the upper metal layer is disposed above the second dielectric layer to prevent subsequent processing of the second dielectric layer.

4. The method of claim 3, further comprising forming a spacer post adjacent to the bottom electrode and the dielectric layer.

5. The method of claim 1, further comprising forming at least two intermediate layers between the lower metal layer and the upper metal layer, wherein the intermediate layers comprise at least the dielectric layer and an etch stop layer.

* * * * *